US006586330B1

(12) United States Patent
Ludviksson et al.

(10) Patent No.: US 6,586,330 B1
(45) Date of Patent: Jul. 1, 2003

(54) METHOD FOR DEPOSITING CONFORMAL NITRIFIED TANTALUM SILICIDE FILMS BY THERMAL CVD

(75) Inventors: Audunn Ludviksson, Scottsdale, AZ (US); Joseph T. Hillman, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 60 days.

(21) Appl. No.: 10/140,538

(22) Filed: May 7, 2002

(51) Int. Cl.$^7$ .......................................... H01L 21/4763
(52) U.S. Cl. ...................... 438/643; 438/653; 438/680; 438/683; 438/685
(58) Field of Search ................................ 438/643, 653, 438/680, 683, 685

(56) References Cited

U.S. PATENT DOCUMENTS

| | | | | |
|---|---|---|---|---|
| 4,608,271 | A | | 8/1986 | Hieber et al. .................. 427/38 |
| 5,919,531 | A | | 7/1999 | Arkles et al. ................ 427/576 |
| 5,989,999 | A | * | 11/1999 | Levine et al. ................ 438/627 |
| 6,066,196 | A | * | 5/2000 | Kaloyeros et al. .......... 106/1.18 |
| 6,139,922 | A | | 10/2000 | Kaloyeros et al. ........... 427/576 |
| 6,156,630 | A | * | 12/2000 | Iyer ............................ 438/683 |
| 6,184,073 | B1 | * | 2/2001 | Lage et al. .................. 438/238 |
| 6,404,058 | B1 | * | 6/2002 | Taguwa ........................ 257/770 |
| 2001/0025205 | A1 | * | 9/2001 | Chern et al. ................. 700/121 |
| 2002/0070456 | A1 | * | 6/2002 | Taguwa ........................ 257/770 |

OTHER PUBLICATIONS

Reid et al., *Thermodynamic Stability of Ta–Si/Cu Bilayers,* Materials Research Society Conference Proceedings ULSI–VII, 1992.

Harada et al., *Surface Modification of MOCVD–TiN Film by Plasma Treatment and SiH4 Exposure for Cu Interconnects,* Materials Research Society Conference Proceedings ULSI XIV, 1999.

Wieser et al., *Improvement of Ta–Based Thin Film Barriers for Copper Metalization by Ion Implanation of Nitrogen and Oxygen,* Annual report 1999, Institute of Ion Beam Physics and Materials Research, Mar. 2000.

Fischer et al., *Barrier and Contact Behavior of Tantalum Based Thin Films for Use in Copper Metalization Scheme,* www.tu.dresden.de/ethihm/deutsch/forsch/hlt/news/text2amc.pdf, Mar. 29, 2000.

Wiser et al., *Modification of Ta–Based Thin Barriers by ion Implantation of Nitrogen and Oxygen,*www.tudresden.de/etinm/deutsch/forsch/hlt/news/MODITAsw.pdf, Mar. 29, 2000.

\* cited by examiner

*Primary Examiner*—John F. Niebling
*Assistant Examiner*—Lynne A. Gurley
(74) *Attorney, Agent, or Firm*—Wood, Herron & Evans, LLP

(57) ABSTRACT

Method for depositing a nitrified tantalum silicide barrier film on a semiconductor device including a silicon-based substrate with recessed features by low temperature thermal CVD of tantalum silicide and subsequent nitrification. The nitrified tantalum silicide barrier film exhibits high conformality and low fluorine or chlorine impurity content. A specific embodiment of the method includes depositing tantalum silicide by TCVD from the reaction of a TaF$_5$ or TaCl$_5$ precursor vapor with silane gas on a 250° C.–450° C. heated substrate, then exposing the tantalum silicide to a thermal NH$_3$ treatment or an NH$_3$— or N$_2$-containing plasma treatment.

55 Claims, 6 Drawing Sheets

METHOD FOR DEPOSITING CONFORMAL NITRIFIED TANTALUM SILICIDE FILMS BY THERMAL CVD

FIELD OF THE INVENTION

This invention relates generally to a method for depositing tantalum silicide films onto a semiconductor device substrate by thermal chemical vapor deposition, followed by a nitrifying step to form a TaSiN film having low halogen impurity content.

BACKGROUND OF THE INVENTION

In the formation of integrated circuits (IC), thin films containing metal and metalloid elements are deposited upon the surface of a semiconductor substrate or wafer. The films provide conductive and ohmic contacts in the circuits and between the various devices of an IC. For example, a thin film of a desired metal might be applied to the exposed surface of a contact or via in a semiconductor substrate. The film, passing through the insulative layers of the substrate, provides plugs of conductive material for the purpose of making interconnections across the insulating layers. One well-known process for depositing thin metal films is chemical vapor deposition (CVD). Another well-known process is physical vapor deposition (PVD), also referred to as sputtering.

In silicon-based integrated circuit technology, aluminum, copper, or tungsten may be used for interconnections and contacts. These conductor materials are typically deposited onto a diffusion barrier layer, such as TiN, Ta, TaN, and WN, which provide a barrier between the conductor and the silicon or silicon-based substrate. Copper as the conductor material is of particular interest due to its lower electrical resistivity and higher resistance to electromigration as compared to aluminum. However, copper has a high mobility and lifetime degradation in silicon, and will react to silicon at low annealing temperature. Thus, a high level of performance must be borne by diffusion barriers in copper metallizations of silicon.

It is generally believed that the addition of silicon and nitrogen to diffusion barrier layers, such as tantalum, improves the film's resistance to copper diffusion, while maintaining the desired physical, chemical and electrical properties. It is believed that formation of silicides circumvents fast grain boundary diffusion of copper atoms through the barrier layers to the silicon substrate surface. In Harada et al., "Surface Modification of MOCVD-TiN Film by Plasma Treatment and $SiH_4$ Exposure for Cu Interconnects," Conference Proceedings ULSI XIV pp. 329–335 (1999 Materials Research Society), a method was proposed for incorporating silicon into a TiN barrier layer deposited by MOCVD using TDMAT (tetrakis-dimethylamino-titanium). Plasma treatment alone was found to be ineffective for densifying the film, due to the plasma treatment process leaving the porous TiN film untreated on the sidewalls of substrate features. Likewise, a $SiH_4$ exposure alone was found to be ineffective in that it increased the via resistance to an unacceptable degree. The solution was found to be a plasma treatment of the TiN film followed by exposure to $SiH_4$ to achieve both high barrier performance on the sidewalls of substrate features and the low resistivity of the film. It was found that the anisotropic nature of the plasma treatment induced the self-aligned surface modification of the TiN film during the $SiH_4$ exposure. It is noted that the method discussed in Harada et al. required a non-dense film in order to be effective. Further, if the TiN film was densified with a plasma anneal in an ammonia environment, then the thermal silane anneal was less effective due to most of the silicon being at the surface rather than penetrating to the bulk of the densified film. Moreover, Ti and TiN barrier layers are generally considered to be less effective as barriers to copper as compared to Ta and TaN barrier layers.

Sputtered tantalum (Ta) and reactive sputtered tantalum nitride (TaN) have been demonstrated to be good diffusion barriers between copper and a silicon-based substrate due to their high conductivity, high thermal stability and resistance to diffusion of foreign atoms. A discussion of the thermodynamic stability of Ta—Si/Cu bilayers may be found in Reid et al., "Thermodynamic Stability of Ta—Si/Cu Bilayers," Conference Proceedings ULSI-VII pp. 285–291 (1992 Materials Research Society) in which Ta—Si barrier layers were deposited onto silicon dioxide by physical vapor deposition (PVD) from a Ta—Si sputter target, followed by copper PVD. Reid et al. predicted the tantalum silicide compounds are stable with copper at room temperature, and assuming that finding also holds at higher temperatures, implied that copper will not react with any tantalum silicide during annealing on the basis of thermodynamics.

Work by Wieser et al. in Germany has included RF magnetron sputtering of polycrystalline Ta and Ta—Si films, followed by ion implantation of nitrogen and oxygen for purposes of amorphization, nitrification and densification of the films to increase barrier performance and stability. Wieser et al., "Modification of Ta-based Thin Film Barriers by Ion Implantation of Nitrogen and Oxygen," http://www.tu-dresden.de/etihm/deutsch/forsch/hlt/news/MODITAsw.pdf, last modified Mar. 29, 2000. Work by Fischer et al. in Germany has included RF sputtering of Ta—Si—N films using a Ta—Si target and $N_2$ gas. Fischer et al., Barrier and Contact Behavior of Tantalum Based Thin Films for Use in Copper Metallization Scheme," http://www.tu-dresden.de/etihm/deutsch/forsch/hlt/news/text2amc.pdf, last modified Mar. 29, 2000.

However, PVD-deposited Ta, Ta—Si, and Ta—Si—N films inherently have poor step coverage due to shadowing effects. Thus, the sputtering process is limited to relatively large feature sizes (>0.3 $\mu$m) and small aspect ratio contact vias. CVD offers the inherent advantage over PVD of better conformality, even in small structures (<0.25 $\mu$m) with high aspect ratios. However, CVD of Ta with metal-organic sources such as tertbutylimidotris-diethylamido-tantalum (TBTDET), pentakis-dimethylamino-tantalum (PDMAT) and pentakis-diethylamino-tantalum (PDEAT) yields mixed results. An additional problem with MOCVD of Ta is that the resulting films have relatively high concentrations of oxygen and carbon impurities.

Processes that deposit films at relatively low temperatures, for example less than about 500° C., would provide an advantage in the formation of copper barriers in the next generation of IC. Ideally, the deposited film will have a high step coverage (the ratio of the coating thickness of a film along the walls of a feature to the thickness on the top surface of the substrate or wafer adjacent the feature), good diffusion barrier properties, minimal impurities, low resistivity and good conformality (even coverage of complex topography of high aspect ratio features). In general, plasma enhanced CVD (PECVD) methods may be carried out at lower temperatures than thermal CVD (TCVD) methods due to the plasma providing the necessary energy for reducing the precursor, but TCVD methods are capable of providing higher conformality and step coverage than PECVD methods. While Reid et al. recognized the effectiveness of amorphous suicides in tantalum diffusion barriers in the context of PVD, and Wieser et al. and Fischer et al. recognized the effectiveness of the addition of nitrogen to amorphous suicides in tantalum diffusion barriers in the context of PVD, a low temperature method is needed for depositing conformal amorphous nitrified tantalum silicide films used as barrier layers in copper metallization of silicon.

SUMMARY OF THE INVENTION

The present invention provides a method for depositing and nitrifying a tantalum silicide barrier film to provide a semiconductor device having improved diffusion barrier properties. To this end, an amorphous tantalum silicide (TaSi$_y$) film is deposited by TCVD onto a semiconductor device substrate having a temperature of about 250° C.–450° C. by reacting a tantalum pentafluoride (TaF$_5$) or tantalum pentachloride (TaCl$_5$) precursor vapor with silane (SiH$_4$) gas under reduced pressure in a reaction chamber containing the substrate. The TaSi$_y$ film is then exposed to a NH$_3$— or N$_2$-containing plasma or thermal NH$_3$ post-treatment to nitrify the film thereby forming conformal, amorphous nitrified-TaSi$_y$ (TaSiN) having low halogen impurity content and high step coverage. In one example, a silicon-based substrate was fabricated having a 100 Å (10 nm) nitrified tantalum silicide barrier film on its surface and on the surfaces of a 4:1 aspect ratio recessed feature with greater than 75% step coverage, a sheet resistance of about 500 $\mu$ohm-cm, and less than about 4% fluorine impurity incorporated in the film.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPION

There is provided a method for depositing TCVD-TaSi films and subsequently nitrifying the deposited film for the purpose of providing an effective TaSiN diffusion barrier film with respect to copper metallization. In addition to the deposition of an amorphous tantalum silicide film and uniform nitrogen incorporation, a low halogen impurity content, particularly fluorine or chlorine content of the film present from the fluoride- and chloride-based precursors used for the TCVD, is also observed and an improvement in conformality over PVD and PECVD TaSi$_y$ and TaSiN films is observed. To this end, and in accordance with the present invention, a TaF$_5$ or TaCl$_5$ precursor vapor is reacted with a silane containing process gas under low temperature, low pressure TCVD conditions to deposit TaSi$_y$, followed by exposure of the TaSi$_y$ to a nitrifying post-treatment. The post-treatment may comprise thermal incorporation of nitrogen using NH$_3$ in the absence of plasma or may comprise plasma incorporation of nitrogen using NH$_3$— or N$_2$-containing plasma.

Figure 1:
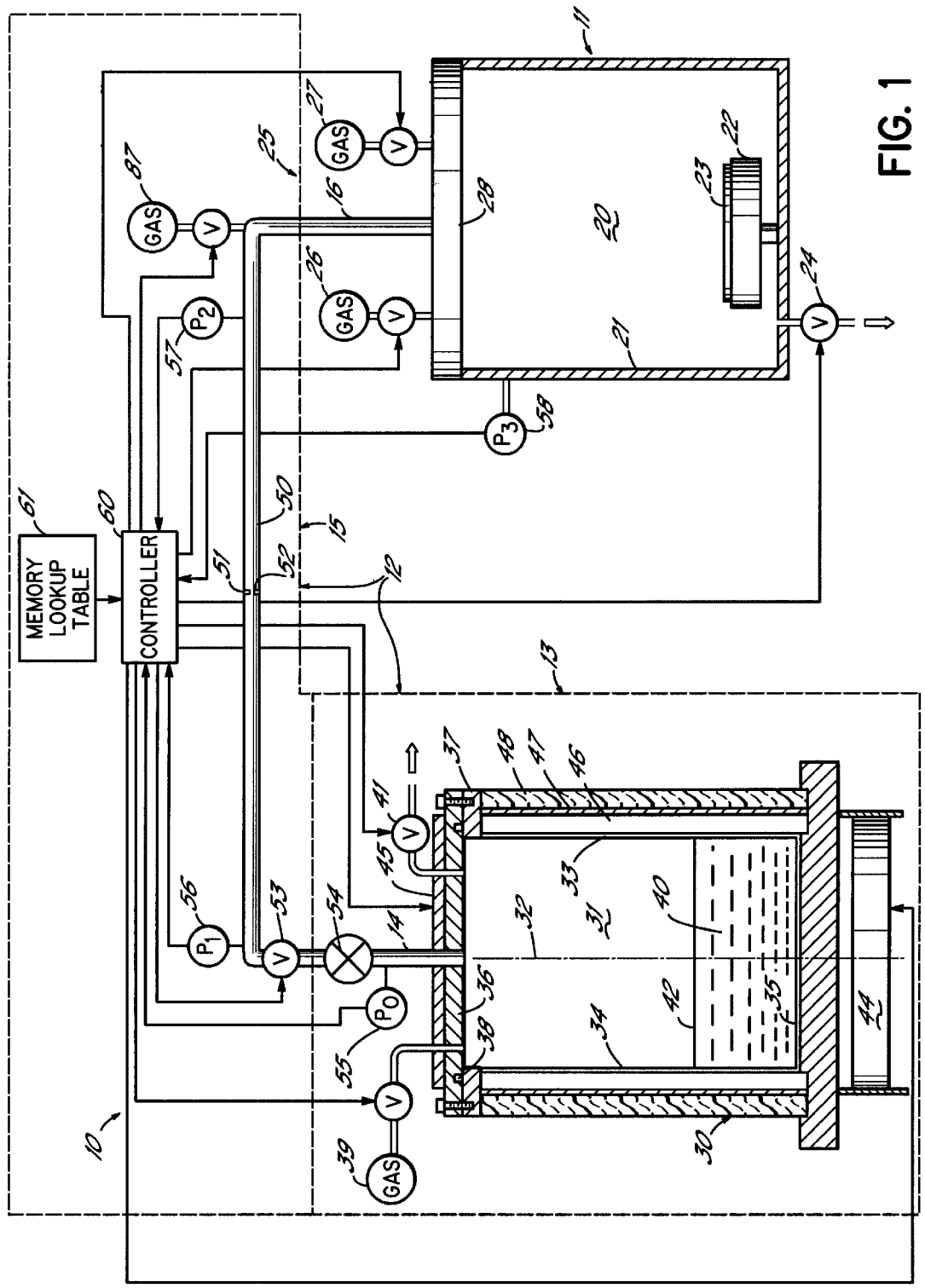
FIG. 1 is a side view, partially in cross-section, of a reactor used to practice the method of the present invention.

By way of example only, TCVD of TaSi$_y$ may be carried out using the following method and apparatus. FIG. 1 diagrammatically illustrates a chemical vapor deposition (CVD) system 10 that includes a CVD reactor 11 and a precursor delivery system 12, connected to the reactor 11 and which includes the system components responsible for the delivery of precursor vapor to the reactor 11. In the reactor 11, a reaction is carried out to convert a precursor vapor of TaF$_5$ or TaCl$_5$ into a tantalum silicide film.

The precursor delivery system 12 is made up of a source 13 of precursor vapor and a metering system 15. The source 13 has an outlet 14, which connects to the metering system 15, which in turn is connected to a reactant gas inlet 16 of the CVD reactor 11. The source 13 is configured to supply a TaF$_5$ or TaCl$_5$ precursor vapor from a solid or liquid tantalum pentafluoride or pentachloride compound, at a rate that is sufficient to support the TCVD reaction in the chamber 11. The tantalum pentafluoride and tantalum pentachloride compounds are ones that are in a solid state when at standard temperature and pressure. The precursor in the source is maintained at a controlled temperature that will produce a desired vapor pressure of the precursor at the outlet 14 of the source 13 where it connects to the metering system 15. Preferably, the vapor pressure of the precursor itself is sufficient to allow the metering system 15 to deliver the precursor vapor to the reactor 11 at a desired flow rate without the use of a carrier gas. The metering system IS maintains a flow of the precursor vapor from the source 13 into the reactor 11 at a rate that is sufficient to maintain a commercially viable CVD process in the reactor 11.

The reactor 11 is a generally conventional CVD reactor and includes a vacuum chamber 20 that is bounded by a vacuum tight chamber wall 21. In the chamber 20 is situated a substrate support or susceptor 22 on which a substrate such as a semiconductor wafer 23 is supported. The chamber 20 is maintained at a vacuum appropriate for the performance of a CVD reaction that will deposit a film such as a tantalum silicide barrier layer on the semiconductor wafer substrate 23. A preferred pressure range for the CVD reactor 11 is in the range of from 0.2 to 5.0 Torr, preferably in the range of from 1 to 2 Torr. The vacuum is maintained by controlled operation of a vacuum pump 24 and of inlet gas sources 25 that may include, for example, an optional inert gas source 27 for a gas such as argon (Ar) or helium (He) and one or more reducing gas sources 26 of silane (SiH$_4$) and, for example, hydrogen H$_2$) for use in carrying out a tantalum pentafluoride or pentachloride reduction reaction to deposit TaSi$_y$. The gases from the sources 25 enter the chamber 20 through a showerhead 28 that is situated at one end of the chamber 20 opposite the substrate 23, generally parallel to and facing the substrate 23.

The precursor gas source 13 includes a sealed evaporator 30 having therein an evaporation vessel 31, which is preferably in the shape of a cylinder having a vertically oriented axis of symmetry 32. The vessel 31 has a cylindrical inner wall 33 formed of a high temperature tolerant and non-corrosive material such as the alloy INCONEL 600. The inside surface 34 of the wall 33 is highly polished and smooth. The wall 33 has a flat circular closed bottom 35 and an open top, which is sealed by a cover 36 of the same heat tolerant and non-corrosive material as the wall 33. The outlet 14 of the source 13 is situated in the cover 36. The cover 36 is sealed to a flange ring 37 that is integral to the top of the wall 33 by a vacuum tight seal 38. The seal 38 is preferably a high temperature tolerant vacuum compatible seal material such as HELICOFLEX, which is formed of a C-shaped nickel tube surrounding an INCONEL coil spring. However, because $TaF_5$ and $TaCl_5$ require lower temperatures than other known precursors, a conventional elastomeric O-ring may be used to seel the cover 36 to the flange ring 37.

Connected to the vessel 31 through the cover 36 is a source 39 of a carrier gas or purge gas, which is preferably an inert gas such as helium or argon. The source 13 includes a mass of precursor material such as tantalum pentafluoride or pentachloride contained in and situated at the bottom of the vessel 31, which is loaded into the vessel 31 at standard temperature and pressure in a solid state. The vessel 31 is filled with tantalum pentafluoride or pentachloride vapor by placing the solid mass of $TaF_5$ or $TaCl_5$ in the vessel 31 and sealing the cover 36 to the top of the vessel wall 33, then heating the wall 33 of the vessel 31 to raise the temperature of the $TaF_5$ or $TaCl_5$ compound sufficiently high to achieve a desired $TaF_5$ or $TaCl_5$ vapor pressure in vessel 31.

The precursor is supplied as a precursor mass 40 that is placed at the bottom of the vessel 31, where it is heated, preferably to a liquid state as long as the resulting vapor pressure is in an acceptable range. Purge gas and $TaF_5$ or $TaCl_5$ vapors are, however, first evacuated from the vessel 31 with a vacuum pump 41, which is connected through the cover 36, so that only $TaF_5$ or $TaCl_5$ vapor from the $TaF_5$ or $TaCl_5$ mass 40 remains in the vessel 31. Where the mass 40 is liquid, the vapor lies above the level of the liquid mass 40. Because wall 33 is a vertical cylinder, the surface area of $TaF_5$ or $TaCl_5$ mass 40, if a liquid, remains constant regardless of the extent of depletion of the $TaF_5$ or $TaCl_5$.

The delivery system 12 is not limited to direct delivery of a precursor 40 but can be used in the alternative for delivery of precursor 40 along with a carrier gas, which can be introduced into the vessel 31 from gas source 39. Such a gas may be hydrogen ($H_2$) or an inert gas such as helium (He) or argon (Ar). Where a carrier gas is used, it may be introduced into the vessel 31 so as to distribute across the top surface of the precursor mass 40 or may be introduced into the vessel 31 so as to percolate through the mass 40 from the bottom 35 of the vessel 31 with upward diffusion in order to achieve maximum surface area exposure of the mass 40 to the carrier gas. Yet another alternative is to vaporize a liquid that is in the vessel 31. However, such alternatives add undesired particulates and do not provide the controlled delivery rate achieved by the direct delivery of the precursor, that is, delivery without the use of a carrier gas. Therefore, direct delivery of the precursor is preferred.

Where it is desirable to introduce the precursor into the reaction chamber 11 through the showerhead 28 along with a carrier gas, it is preferred that the carrier gas be introduced into tube 50 near its outlet end, from a source 87 connected downstream of the downstream pressure sensor 57 of the metering system 15 so that it does not interfere with the accurate flow rate delivery of direct precursor delivery that is preferred with the system 10.

To maintain the temperature of the precursor 40 in the vessel 31, the bottom 35 of the wall 33 is in thermal communication with a heater 44, which maintains the precursor 40 at a controlled temperature, preferably above its melting point, at such a temperature that will produce a vapor pressure in the approximate range of at least about 3 Torr, preferably in the range of from about 4 to about 10 Torr, when pure precursor vapor is used, and at a lower vapor pressure of about 1 Torr when a carrier gas is used. The exact vapor pressure depends upon other variables such as the quantity of carrier gas, the effective surface area of the mass 40 and other variables.

In a direct tantalum delivery system 10, that is, in a system for delivery of tantalum pentafluoride and pentachloride precursors without a carrier gas, a preferred vapor pressure can be maintained of at least 5 Torr by heating the precursor in the 80° C. to 150° C. range, preferably at about 85° C., for $TaF_5$ and in the 130° C. to 150° C. range, preferably at about 140° C., for $TaCl_5$. In any event, the temperature should not be so high as to cause premature reaction of the precursor vapor with reducing gases in a mixing chamber within the showerhead 28 or elsewhere before contacting the wafer 23.

For purposes of example, using a $TaF_5$ precursor mass 40, a temperature of 85° C. is assumed to be the control temperature for the heating of the bottom 35 of the vessel 31. This temperature is appropriate for producing a desired vapor pressure with a $TaF_5$ precursor. Given this temperature at the bottom 35 of the vessel 31, to prevent condensation of the precursor vapor on the walls 33 and on the cover 36 of the vessel 31, the cover 36 is maintained at the same or a higher temperature than the heater 44 at the bottom 35 of the wall 33 of, for example, 85° C., by a separately controlled a heater 45 that is in thermal contact with the outside of the cover 36. The temperature in the vessel 31 should be kept below the temperature at which $TaF_5$ gas would decompose to form $TaF_x$ (x<5) compounds.

The sides of the vessel wall 33 are surrounded by an annular trapped air space 46, which is contained between the vessel wall 33 and a surrounding concentric outer aluminum wall or can 47. The can 47 is further surrounded by an annular layer of silicone foam insulation 48. This temperature maintaining arrangement keeps the vapor in a volume of the vessel bounded by the cover 36, the sides of the walls 33 and the surface 42 of the precursor mass 40 at the desired temperature of about 85° C. and at a pressure of at least about 3 Torr, preferably at least about 5 Torr.

The vapor flow metering system 15 includes a delivery tube 50 of at least ½ inch in diameter, or at least 10 millimeters inside diameter, and preferably larger so as to provide no appreciable pressure drop at the flow rate desired, which is at least approximately 2 to 40 standard cubic centimeters per minute (sccm). The tube 50 extends from the precursor gas source 13, to which it connects at its upstream end to the outlet 14, to the reactor 11 to which it connects at its downstream end to the inlet 16. The entire length of the tube from the evaporator outlet 14 to the reactor inlet 16 and the showerhead 28 of the reactor chamber 20 is also preferably heated to above the evaporation temperature of the precursor gas, for example, to 150° C. The precursor is preferably at its coldest point in the system 10 at the precursor mass 40.

In the tube 50 is provided a baffle plate 51 in which is centered a circular orifice 52, which preferably has a diameter of approximately 0.089 inches. With a typical pressure drop from the precursor gas source outlet 14 to the reactor inlet 16, which may be of approximately 5 Torr, for example, a viscous or laminar flow, and not a turbulent flow, is maintained in the tube 50. A variable orifice control valve 53 is provided in the tube 50 between the baffle 51 and the precursor gas source outlet 14 to control the pressure in the tube 50 upstream of the baffle 51 and thereby control the flow rate of precursor gas through the orifice 52 and the tube 50 to the inlet 16 of the reactor 11. A shut-off valve 54 is provided in the line 50 between the outlet 14 of the evaporator 13 and the control valve 53 to close the vessel 31 of the evaporator 13.

Pressure sensors 55–58 are provided in the system 10 to provide information to a controller 60 for use in controlling the system 10, including controlling the flow rate of precursor gas from the delivery system 15 into the chamber 20 of the CVD reactor 11. The pressure sensors include sensor 55 connected to the tube 50 between the outlet 14 of the evaporator 13 and the shut-off valve 54 to monitor the pressure in the evaporation chamber 31. A pressure sensor 56 is connected to the tube 50 between the control valve 53 and the baffle 51 to monitor the pressure upstream of the orifice 52, while a pressure sensor 57 is connected to the tube 50 between the baffle 51 and the reactor inlet 16 to monitor the pressure downstream of the orifice 52. A further pressure sensor 58 is connected to the chamber 20 of the reactor 11 to monitor the pressure in the CVD chamber 20. The control valve 53 is operative to affect a pressure drop from the control valve 53, through the orifice 52 and into the reaction chamber 11 that can be varied above about 10 milliTorr and to produce a flow rate of precursor into the chamber 11 that is proportional to this controlled pressure drop.

Control of the flow of precursor vapor into the CVD chamber 20 of the reactor 11 is achieved by the controller 60 in response to the pressures sensed by the sensors 55–58, particularly the sensors 56 and 57 which determine the pressure drop across the orifice 52. When the conditions are such that the flow of precursor vapor through the orifice 52 is unchoked flow, the actual flow of precursor vapor through the tube 52 is a function of the pressures monitored by pressure sensors 56 and 57, and can be determined from the ratio of a) the pressure measured by sensor 56, on the upstream side of the orifice 52, to b) the pressure measured by sensor 57, on the downstream side of the orifice 52.

When the conditions are such that the flow of precursor vapor through the orifice 52 is choked flow, the actual flow of precursor vapor through the tube 52 is a function of only the pressure monitored by upstream pressure sensor 57. In either case, the existence of choked or unchoked flow can be determined by the controller 60 by interpreting the process conditions. When the choked/unchoked determination is made by the controller 60, the flow rate of precursor gas can then be determined by the controller 60 through calculation.

Preferably, accurate determination of the actual flow rate of precursor gas is calculated by retrieving flow rate data from lookup or multiplier tables stored in a non-volatile memory 61 accessible by the controller 60. When the actual flow rate of the precursor vapor is determined, the desired flow rate can be maintained by a closed loop feedback control of one or more of the variable orifice control valve 53, the CVD chamber pressure through evacuation pump 24 or control of reducing or inert gases from sources 26 and 27, or by control of the temperature and vapor pressure of the precursor gas in chamber 31 by control of heaters 44 and 45. Numerous other apparatuses and methods for depositing tantalum silicide by TCVD are available to one skilled in the art, and the present invention is not to be limited to any particular apparatus or method, such as that shown and described in FIG. 1.

The present invention includes nitrifying a $TaSi_y$ film that is deposited by a TCVD process. In the case of $TaF_5$ precursors, the $TaF_5$ and $SiH_4$ precursors react under reduced pressure on a heated substrate, such as $SiO_2$, to form a tantalum silicide film. Nitrogen is then incorporated into the deposited film. Direct reaction of $TaF_5$, $SiH_4$ and $NH_3$ results in deposition of TaSiN films with high F content due to formation of non-volatile $NH_4F$ species that are incorporated into the film. In the TCVD reaction involving only $TaF_5$ and $SiH_4$, as used in one embodiment of the present invention, the $SiH_4$ reactant reduces the $TaF_5$ precursor, incorporates Si into the Ta film to form amorphous $TaSi_y$ and forms volatile SiF-containing products that can be effectively removed from the growth surface and the reactor. Consequently, the resulting $TaSi_y$ film has very low F content. Similarly, direct reaction of $TaCl_5$, $SiH_4$ and $NH_3$ results in deposition of TaSiN films with high Cl content due to formation of non-volatile $NH_4Cl$ species that are incorporated into the film. In the TCVD reaction involving only $TaCl_5$ and $SiH_4$, as used in another embodiment of the present invention, the $SiH_4$ reactant reduces the $TaCl_5$ precursor, incorporates Si into the Ta film to form amorphous $TaSi_y$ and forms volatile SiCl-containing products that can be effectively removed from the growth surface and the reactor. Consequently, the resulting $TaSi_y$ film has very low Cl content. Thus, by the method of the present invention, $NH_4F/NH_4Cl$ formation is avoided by a post-nitrifying step following TCVD-$TaSi_y$ deposition from $TaF_5/TaCl_5$ and $SiH_4$ precursors.

To illustrate an embodiment of the method of the present invention, a 500 Å (50 nm) TCVD tantalum silicide film was deposited onto a silicon-based semiconductor substrate having recessed surface features with an aspect ratio of about 4:1 using the following deposition conditions:

TABLE 1

| | |
|---|---|
| Wafer Temperature | 350° C. |
| Susceptor Temperature | 396° C. |
| $TaF_5$ Precursor Flow | 20 sccm |
| $TaF_5$ Vaporization Temperature | 85° C. |
| Silane Flow | 0.5 slm |
| Hydrogen Flow | 0.5 slm |
| Chamber Pressure | 2 Torr |

The $TaSi_y$ composition can be varied from tantalum rich (y<1) to silicon rich (y>1) by varying the $TaF_5/SiH_4$ reactant ratio in the gas stream. TCVD of $TaSi_y$ is more fully described in copending U.S. patent application Ser. No. 10/139,828, entitled "Method for Depositing Tantalum Silicide Films by Thermal Chemical Vapor Deposition," filed on even date herewith, and incorporated by reference herein in its entirety.

Following film deposition, the films were nitrified using the following conditions:

TABLE 2

| Process Parameter | Plasma Post-Treatment | Thermal Post-Treatment |
|---|---|---|
| Wafer Temperature | 350° C. | 350° C. |
| Susceptor Temperature | 396° C. | 396° C. |
| $NH_3$ or $N_2$ Flow | 1 slm $NH_3$ or $N_2$ | 1 slm $NH_3$ |
| Plasma Power | 250 W | 0 W |
| Chamber Pressure | 2 Torr | 2 Torr |
| Post-Treatment Time | 30 seconds | 30 seconds |

The process for depositing TaSiN films can further include an initial nitrifying step to condition the reaction chamber prior to the $TaSi_y$ deposition. Moreover, the deposition and nitrification sequence may be repeated to form thick barrier layers, such as TaSiN layers greater than 100 Å (10 nm).

After deposition and nitrification, the films were characterized for tantalum, silicon, nitrogen, oxygen and fluorine content using Rutherford backscatter spectroscopy (RBS). For a film deposited using 7 TaSi$_y$ deposition steps of about 100 521 (10 nm) and 8 NH$_3$ plasma nitrification steps (before and after each TaSi$_y$ deposition step) under the conditions in Tables 1 and 2, the results of the elemental characterization are summarized below, wherein the composition was analyzed using a 2 layer model with the reported concentration (atomic %) being the average from the 2 layers:

TABLE 3

| Tantalum Content | Silicon Content | Nitrogen Content | Oxygen Content | Fluorine Content |
|---|---|---|---|---|
| 34% | 34% | 24% | 6% | <4% |

Deposition of ultra-thin TaSi$_y$ films on the order of 100 Å (10 nm) or less allows for the nitrifying step to incorporate a significant amount of nitrogen into the deposited film. This is demonstrated by the relatively high nitrogen content of 34% in the thick film that was deposited by repeating the procedure used for the ultra-thin film deposition and nitrification. An XRD phase identification analysis showed the film to be amorphous.

SIMS depth profiling of 100 Å TaSiN films that received different post-nitrification treatments, namely NH$_3$ plasma, NH$_3$+N$_2$ plasma, thermal NH$_3$ or N$_2$ plasma, showed that the amount of nitrogen incorporation into the film was very similar for all treatments. Thus, formation of the TaSiN films in accordance with the present invention may include the use of plasma or thermal NH$_3$ post-treatment, as well as N$_2$ plasma post-treatment. The effectiveness of thermal NH$_3$ post-treatment may provide particular advantage for the deposition of conformal TaSiN films onto high-aspect-ratio structures where the use of an all thermal process is preferred for uniform nitrification of the conformal film, especially on the sidewalls of the feature.

Figure 2A:
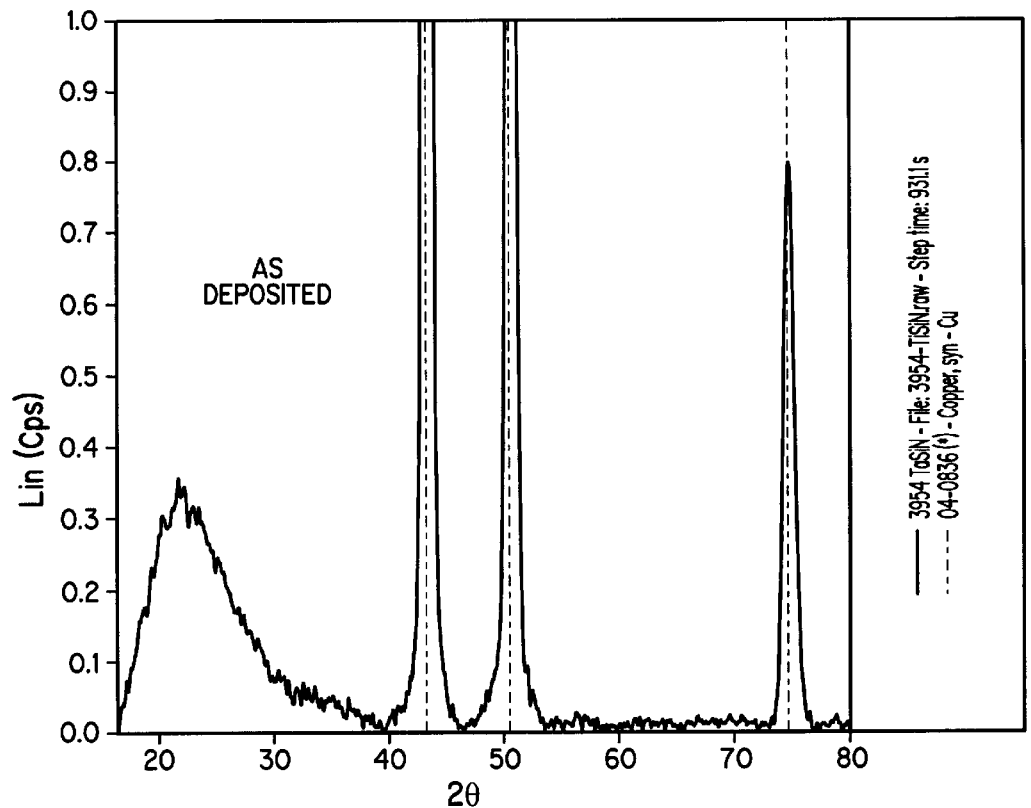
FIGS. 2A–2D are X-ray diffraction (XRD) plots of Cu1TaSiN/SiO$_2$ structures in accordance with the present invention, as deposited and after annealing.
Figure 2B:
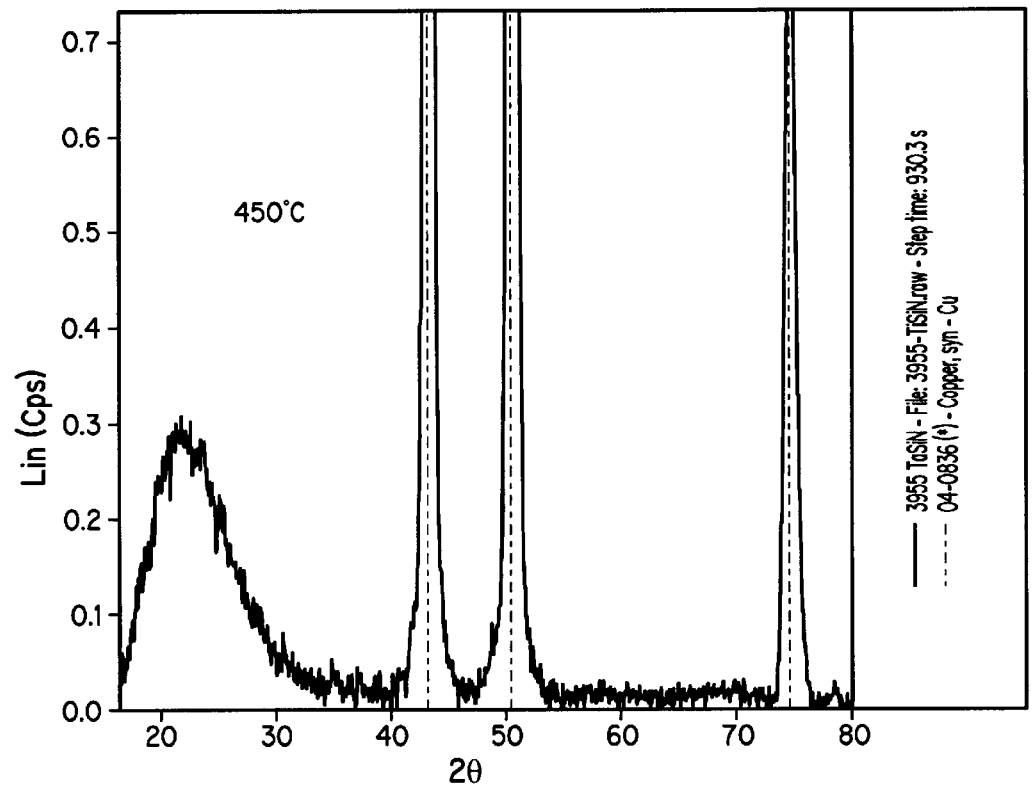
Figure 2C:
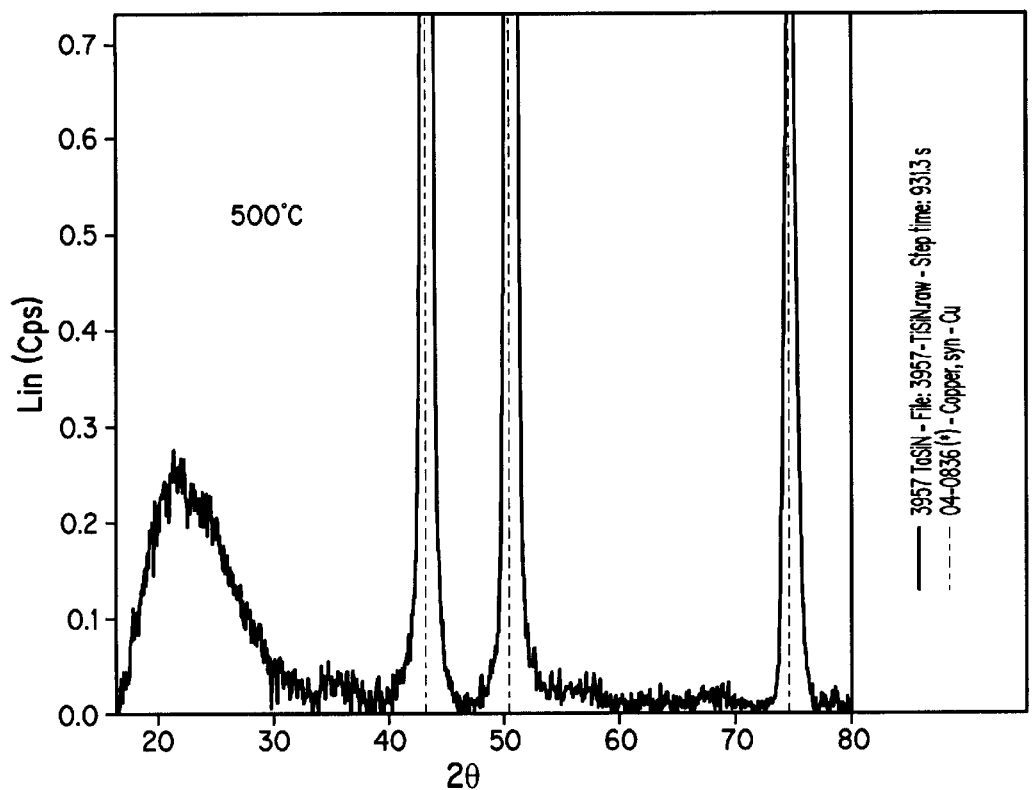
Figure 2D:
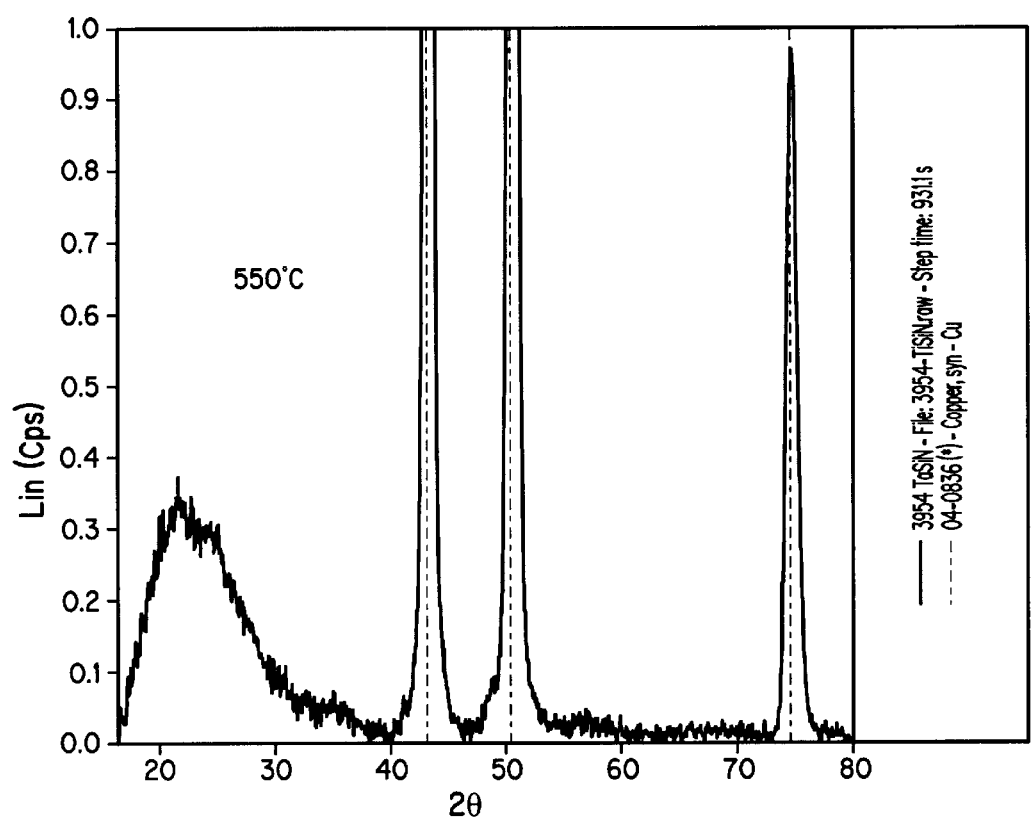
Figure 3A:
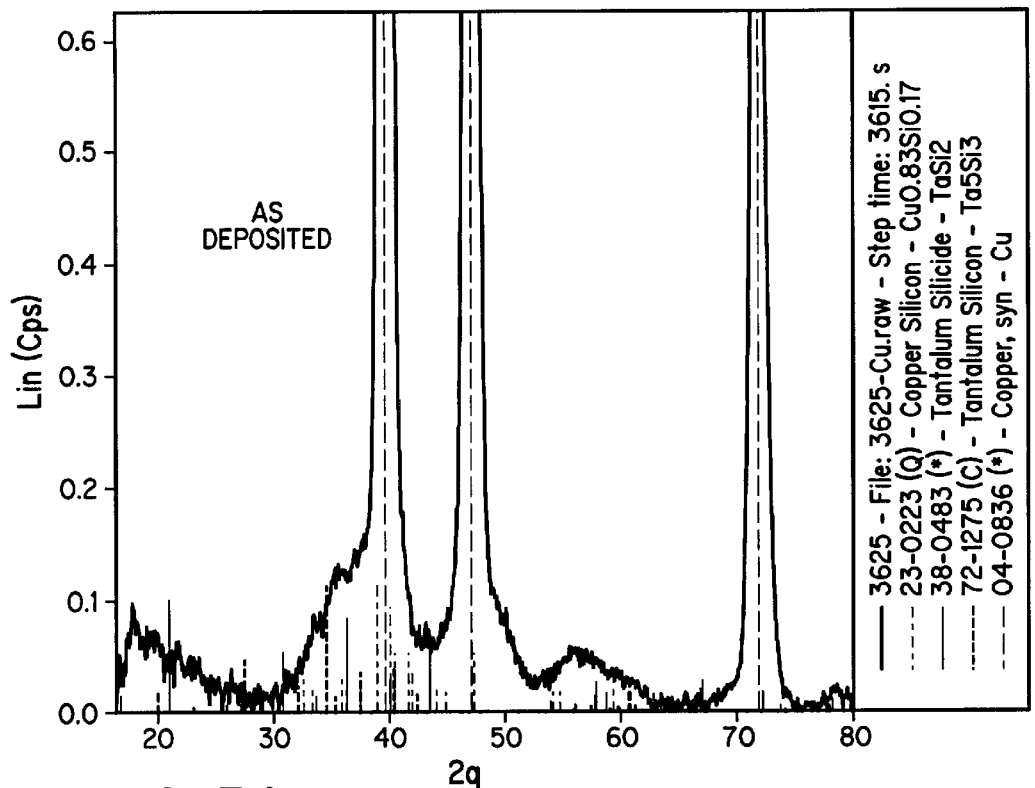
FIGS. 3A–3D are X-ray diffraction (XRD) plots of Cu/TaSi/SiO$_2$ structures without the nitrifying step of the present invention, as deposited and after annealing.
Figure 3B:
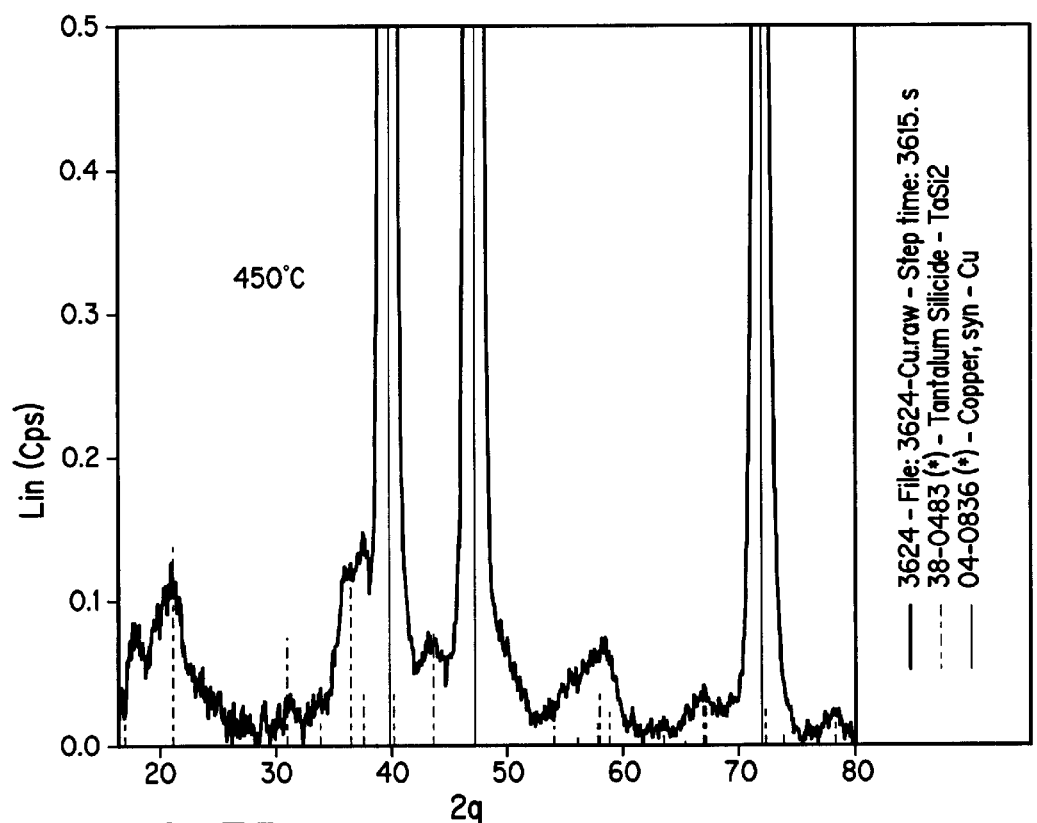
Figure 3C:
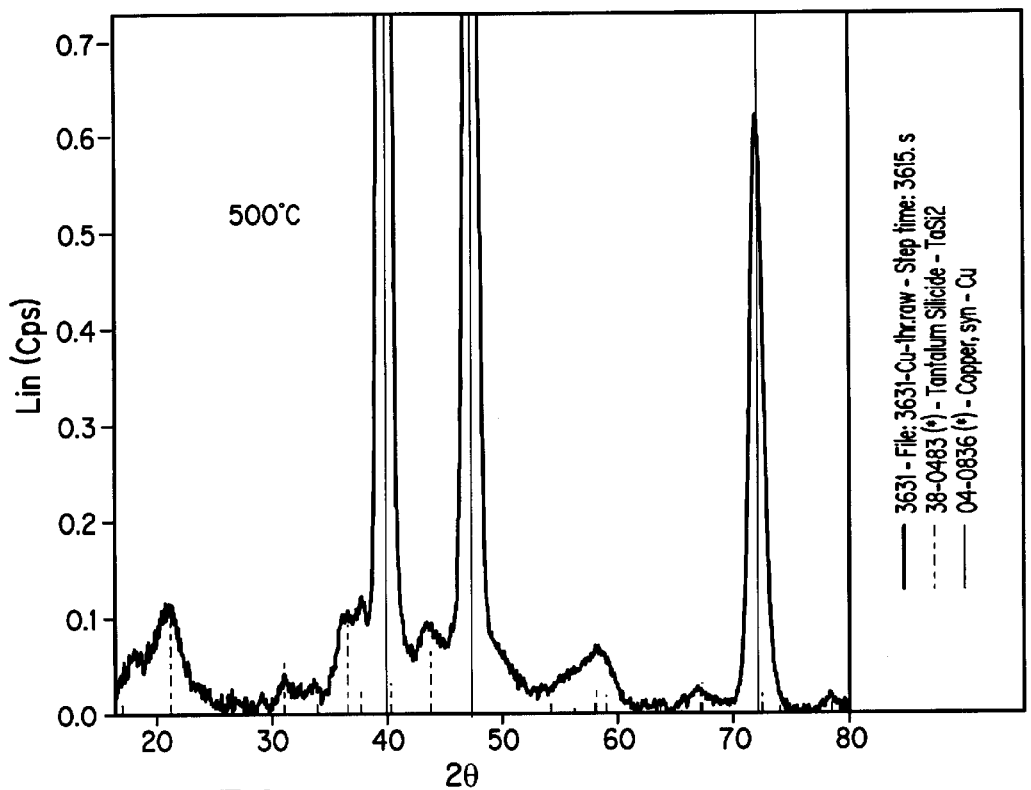
Figure 3D:
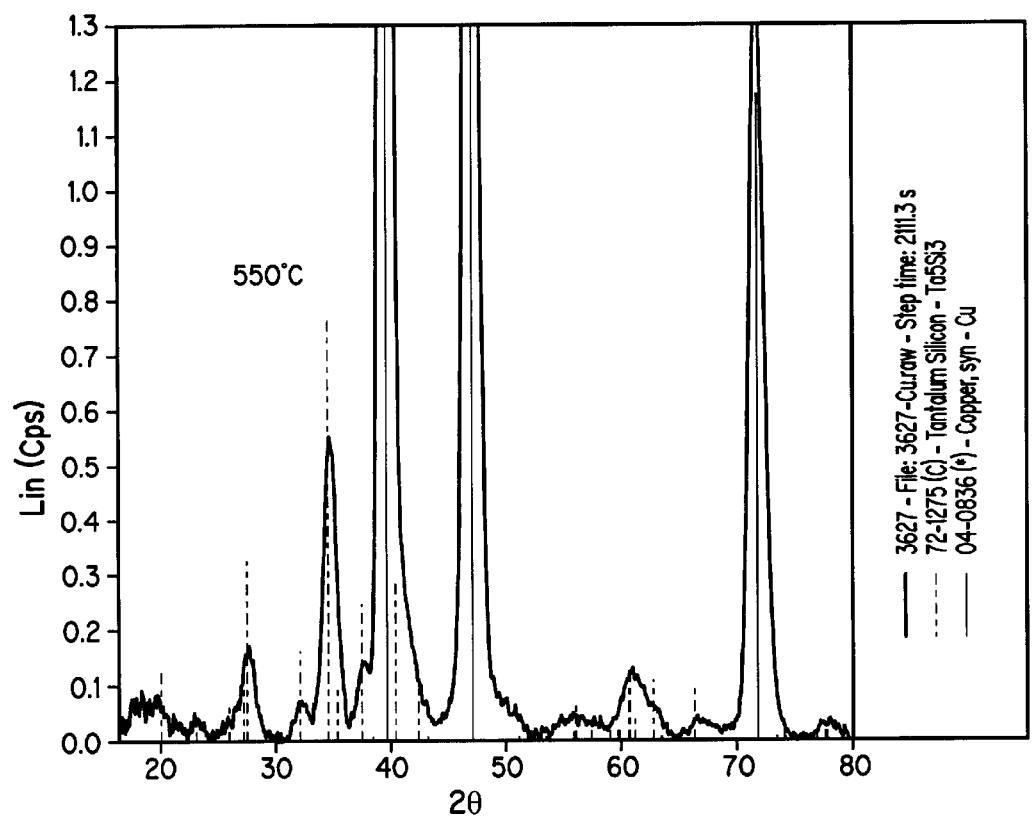

Just as ion implantation of sputtered Ta-based barrier films decreased the density of diffusion enhancing defects and improved the barrier properties, including increased thermal stability, nitrification of conformal TCVD-TaSi$_y$ films in accordance with the present invention achieves improved properties for the barrier film. The thermal stability of the amorphous TaSiN films in contact with Cu is improved when compared to TaSi$_y$ films, as shown by the XRD analysis of FIGS. 2A–2D and 3A–3D. In FIG. 2A, the XRD pattern is provided for the Cu/TaSiN/SiO$_2$ structure, as deposited. FIGS. 2B–2D provide the XRD pattern for the Cu/TaSiN/SiO$_2$ structure after annealing for 30 minutes at 20 Torr with N$_2$ at 450° C., 500° C. and 550° C., respectively. No change in the crystallinity of the amorphous TaSiN barrier layer is observed with increasing temperature up to 550° C. In FIG. 3A, the XRD pattern is provided for the Cu/TaSi/SiO$_2$ structure, as deposited. FIGS. 3B–3D provide the XRD pattern for the Cu/TaSi$_y$/SiO$_2$ structure after annealing for 30 minutes at 20 Torr with N$_2$ at 450° C., 500° C. and 550° C., respectively. In contrast to the films formed in accordance with the present invention, the as-deposited amorphous TaSi films not subjected to subsequent nitrification begin to crystallize upon annealing to temperatures in the 450–550° C. range, as observed by the detection of TaSi$_2$ and Ta$_5$Si$_3$ crystalline phases. The XRD analysis thus illustrates the stabilization of the amorphous film by nitrogen implantation in accordance with the present invention.

Figure 4:
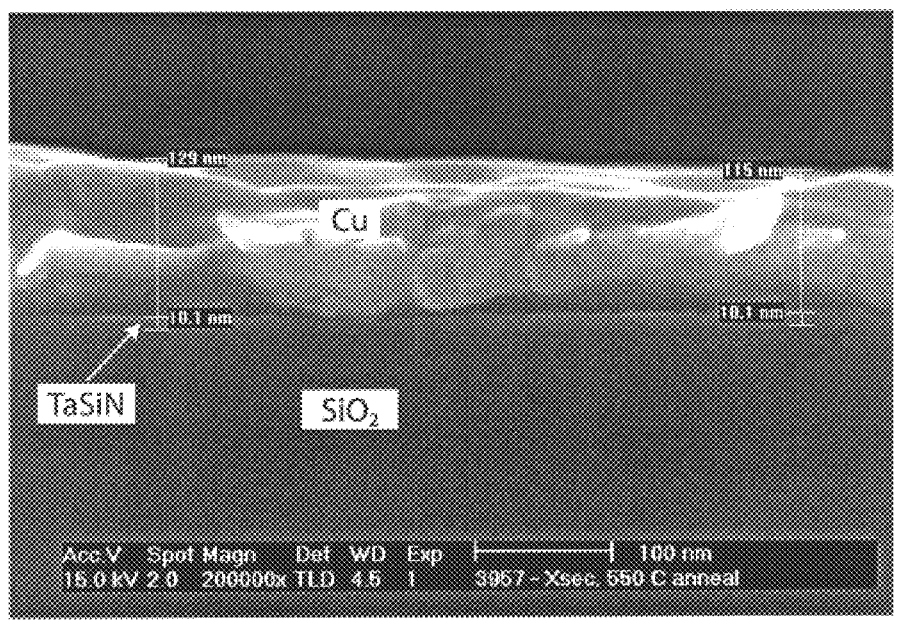
FIG. 4 is a cross-sectional scanning electron micrograph (SEM) of an annealed Cu/TaSiN/SiO$_2$ structure in accordance with the present invention.
Figure 5:
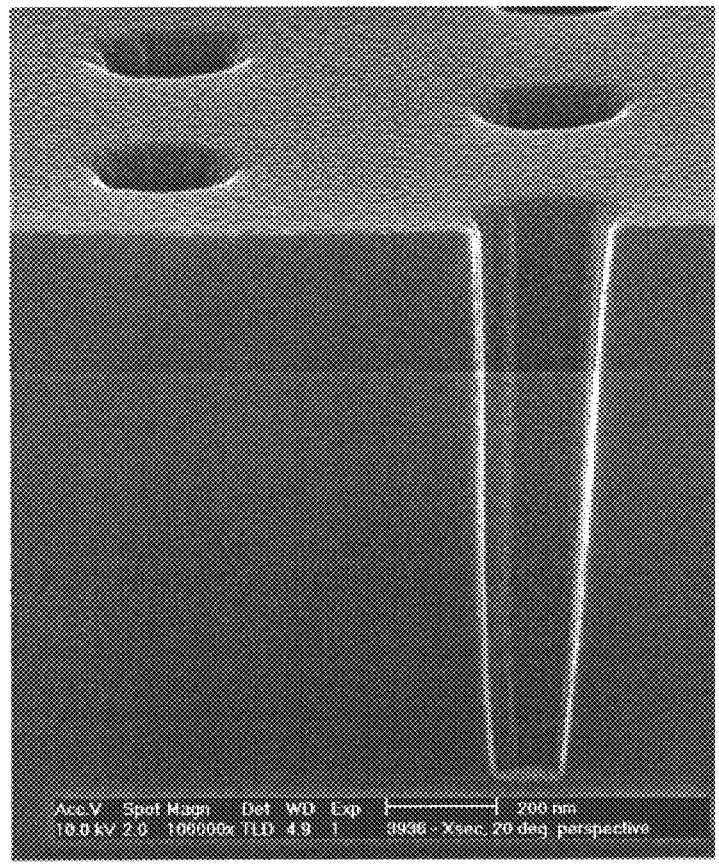
FIG. 5 is a composite cross-sectional scanning electron micrograph (SEM) of a TaSiN/SiO$_2$ structure in accordance with the present invention.

FIG. 4 provides a cross-sectional SEM image of a structure including an SiO$_2$ substrate, a 10 nm (100 Å) TaSiN film, and a 120 nm Cu overlayer, the TaSiN deposited and nitrified as described above in Tables 1 and 2, and the structure annealed at 550° C. for 30 minutes at 20 Torr with N$_2$. The 0.225 µm SiO$_2$ structure having a 4:1 aspect ratio recessed feature is further shown in FIG. 5 as a composite cross-sectional SEM. The conformality is shown to be approximately 100%, and the step coverage is above 75%. The electrical resistance was about 500 µohm-cm as measured using a 4-point probe. The electrical resistance is substantially equal to that measured for the TaSi$_y$ film without nitrification, illustrating that the amorphous structure is stabilized by post-nitrification without degrading the electrical properties of the film. Morever, while PVD and PECVD typically achieve only 5–10% conformality in 4:1 aspect ratio features, a TCVD TaSiN film can exhibit up to 100% conformality.

Films deposited by the method of the present invention using TaF$_5$ exhibit low fluorine content. The low fluorine content achieved is due to the high volatility SiF-containing compounds produced by the reaction of TaF$_5$ vapor with silane gas. In the reduction of TaCl$_5$, the formation of SiCl-containing compounds is not quite as favorable as is the formation of SiF-containing compounds in the reduction of TaF$_5$. Nonetheless, the low temperature TCVD conditions in combination with the TaCl$_5$ precursor and silane reducing gas are expected to result in low chlorine impurity content. Moreover, TaF$_5$ reaction with alternative silicon halide-containing sources increases the halogen content available in the system that can be incorporated in the deposited film, whereas silane does not include a halogen. The volatile SiF-containing products produced by the reaction of silane with TaF$_5$ are effectively removed from the growth surface, resulting in very low F content in the as-deposited TaSi$_y$ film. Likewise, volatile SiCl-containing products produced by the reaction of silane with TaCl$_5$ can be effectively removed from the growth surface, resulting in very low Cl content in the as-deposited TaSi$_y$ film. Post-nitrification in accordance with the present invention further avoids non-volatile NH$_4$F or NH$_4$Cl formation that can contribute to elevated halogen impurity incorporation in the barrier film.

The finding that a TaF$_5$ or TaCl$_5$ vapor precursor could be reacted with silane gas in a low temperature thermal CVD process (<450° C.), followed by nitrogen implantation, to produce a low fluorine or chlorine impurity conformal nitrified-TaSi$_y$ film suitable as a barrier layer to copper diffusion in an IC device was an unexpected one. It is common to expect that a material with a large negative heat of formation, such as iodine- and bromine-based materials, will have a greater tendency to participate in a chemical reaction than a material with a heat of formation that is smaller in magnitude, such as a fluorine-based precursor. Generally speaking, this is correct. However in order to be precise, the thermodynamics of the other reactants, and the products of the reaction must also be considered. The entropy of the system must also be included for an accurate thermodynamic calculation. Making a truly accurate thermodynamic prediction is difficult because many of the values needed for the calculation, especially the entropy values, are not available in the literature. Therefore, the general approximation using the heats of formation of the principal reactants is often used.

Similarly, the binding energy of the valence electrons of the principal reactants can be used to predict their reactivity. Generally, a weaker binding energy will lead to higher reactivity and thus to a species that will react at a lower temperature. In the context of tantalum-based CVD, each halogen behaves differently, thereby making substitution of one halogen for another difficult.

In U.S. Pat. No. 5,919,531, Arkles and Kaloyeros use this argument to teach in favor of using species with lower binding energies than $TaCl_5$ to form tantalum-based compounds. Specifically, they suggest using $TaI_5$ and $TaBr_5$. For depositing silicon-containing films, they use a silicon halide compound, in particular an $SiI_4$ precursor, and $NH_3$ or $N_2$ which generates non-volatile byproducts such as HI, HBr and $NH_4Br$. In U.S. Pat. No. 6,139,922, Arkles and Kaloyeros switch to a $TaF_5$ precursor, but continue to use silicon halide compounds, in particular $SiI_4$ or $SiF_4$, and $NH_3$ or $N_2$ which generates non-volatile HI, HF and $NH_4F$ as major byproducts. In the application under consideration, $TaF_5$ and $SiH_4$ are used as reactants. Both of these reactants were chosen because they provide a higher vapor pressure for delivery to the reaction chamber than the reactants suggested by Arkles et al., and thus offer more control with respect to injecting them into a CVD reaction chamber as a gas. These gases were tested in spite of the fact that the general thermodynamics for the reaction, as described above, are less favorable than for the other precursors. Silane is also used to avoid the presence of excess halide in the reaction. The present invention also does not use $NH_3$ or $N_2$ during deposition so as to avoid non-volatile $NH_4F$ and $NH_4Cl$ byproducts, but rather employs post-deposition nitrification thereby minimizing halogen incorporation in the film.

Although it was expected that a higher reaction temperature would be necessary for the $TaF_5/TaCl_5$ and $SiH_4$ TCVD reaction, our experimental results proved to the contrary. We were able to deposit high quality tantalum silicide films at a temperature of 350° C. using the $TaF_5/TaCl_5$ and $SiH_4$ precursors.

The reason for the unexpected result is not absolutely clear. However, there are several possibilities. Some kinetic factor such as the desorption rate of one or more of the reaction byproducts may be controlling the reaction and forcing the thermodynamics into a metastable regime. Alternatively, some aspect of the actual reaction pathway, which is not apparent from the general thermodynamics described above, may be at work.

The nitrified-$TaSi_y$ barrier layer films formed by the method of the present invention may then be coated with a copper seed layer, in accordance with known techniques. The TCVD-TaSiN film on the silicon-based semiconductor substrate provides an effective diffusion barrier with respect to the copper layer.

While an embodiment of the present invention was described using specific deposition and nitrification parameters, it is to be understood that these parameters may be varied in accordance with the knowledge of one of ordinary skill in the art of CVD. By way of further example and not limitation, the deposition conditions may be approximately as follows:

TABLE 4

| Wafer Temperature | 250–450° C. |
| --- | --- |
| Susceptor Temperature | 250–550° C. |
| $TaF_5/TaCl_5$ Precursor Flow | 1–50 sccm |
| $TaF_5/TaCl_5$ Vaporization Temperature | 80–150° C. |
| Silane Flow | 0.01–10 slm |
| Hydrogen Flow | 0–10 slm |
| Chamber Pressure | 0.1–10 Torr |

Hydrogen gas in addition to silane is optional in the method of the present invention. When used, it may be delivered to the reaction chamber at a flow in the range of about 0.1–10 slm. The presence of hydrogen is advantageous in that it may affect the composition of the deposited $TaSi_y$ film so as to facilitate subsequent incorporation of nitrogen into the deposited film. By way of further example and not limitation, the nitrification conditions may be approximately as follows:

TABLE 5

| Process Parameter | Plasma Post-Treatment | Thermal Post-Treatment |
| --- | --- | --- |
| Wafer Temperature | 250–450° C. | 250–450° C. |
| Susceptor Temperature | 250–550° C. | 250–550° C. |
| $NH_3$ or $N_2$ Flow | 0.01–10 slm $NH_3$ or 0.01–10 slm $N_2$ | 0.01–10 slm $NH_3$ |
| Plasma Power | 0.01–10 kW | 0 W |
| Chamber Pressure | 0.1–10 Torr | 0.1–10 Torr |
| Post-Treatment Time | 2–600 seconds | 2–600 seconds |

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method of depositing a nitrified tantalum silicide (TaSiN) barrier film on a semiconductor device substrate having a temperature in the range of about 250° C.–450° C., the method comprising:

depositing a $TaSi_y$ film on said substrate by a thermal chemical vapor deposition (TCVD) process including providing a vapor of a precursor selected from the group consisting of $TaF_5$ and $TaCl_5$ to a reaction chamber containing said substrate by heating said precursor to a temperature sufficient to vaporize said precursor and combining said vapor with a process gas comprising silane, then incorporating nitrogen into said $TaSi_y$ film to form said TaSiN film by a method selected from the group consisting of:

a) exposing said $TaSi_y$ film to a $NH_3$-containing plasma;

b) exposing said $TaSi_y$ film to a $N_2$-containing plasma; and c) exposing said $TaSi_y$ film to a thermal $NH_3$-containing gas.

2. The method of claim 1, wherein said precursor is tantalum pentafluoride and heating said precursor includes heating to a temperature in the range of about 80° C.–150° C.

3. The method of claim 1, wherein said precursor is tantalum pentachloride and heating said precursor includes heating to a temperature in the range of about 130° C.–150° C.

4. The method of claim 1, wherein heating said precursor includes heating to a temperature sufficient to provide a vapor pressure of said precursor of at least 3 Torr.

5. The method of claim 1, wherein said vapor is provided at a flow rate in the range of about 1–50 sccm.

6. The method of claim 1, wherein said silane is provided to said reaction chamber at a flow rate in the range of about 0.01–10 slm.

7. The method of claim 6, wherein said process gas further comprises $H_2$ and is provided to said reaction chamber at a flow rate in the range of about 0.1–10 slm.

8. The method of claim 1, wherein said TaSi$_y$ film deposition occurs at a pressure of said reaction chamber in the range of about 0.1–10 Torr.

9. The method of claim 1, further comprising depositing a copper layer on said substrate, wherein said TaSiN film is integral with said copper layer.

10. The method of claim 1, wherein said TaSi$_y$ film is deposited at a rate of at least about 100 Å min.

11. The method of claim 1, wherein said substrate comprises an integrated circuit containing a high aspect ratio feature.

12. The method of claim 1, wherein providing said vapor includes delivering said vapor to said reaction chamber substantially without a carrier gas.

13. The method of claim 1, wherein said incorporating nitrogen comprises the method (a) of exposing said TaSi$_y$ film to a NH$_3$-containing plasma.

14. The method of claim 13, wherein said plasma is generated with a plasma power in the range of about 0.01–10 kW.

15. The method of claim 13, wherein said exposing in method (a) is for a time of about 2–600 seconds.

16. The method of claim 13, wherein said NH$_3$-containing plasma further includes N$_2$.

17. The method of claim 1, wherein said incorporating nitrogen comprises the method (b) of exposing said TaSi$_y$ film to a N$_2$-containing plasma.

18. The method of claim 17, wherein said plasma is generated with a plasma power in the range of about 0.01–10 kW.

19. The method of claim 17, wherein said exposing of method (b) is for a time of about 2–600 seconds.

20. The method of claim 1, wherein said incorporating nitrogen comprises the method (c) of exposing said TaSi$_y$ film to a thermal NH$_3$-containing gas.

21. The method of claim 20, wherein said exposing of method (c) is for a time of about 2–600 seconds.

22. The method of claim 1, wherein said depositing and said nitrogen incorporating steps are repeated to form a TaSiN film of desired thickness.

23. The method of claim 1, wherein said depositing step is effected to deposit a TaSi$_y$ film up to about 100 Å, followed by said nitrogen incorporating step, and said depositing and nitrogen incorporating steps are repeated until said TaSiN film is formed to a desired thickness.

24. A method of depositing a nitrified tantalum suicide (TaSiN) barrier film on a semiconductor device substrate having a temperature in the range of about 250° C.–450° C., the method comprising:
   depositing a TaSi$_y$ film on said substrate by a thermal chemical vapor deposition (TCVD) process including delivering a tantalum pentafluoride precursor to a reaction chamber containing said substrate without a carrier gas by heating said precursor to a temperature in the range of about 80° C.–150° C. sufficient to produce a vapor of said precursor to provide a pressure of at least about 3 Torr to deliver said vapor of said precursor and combining said vapor with a process gas comprising silane,
   then incorporating nitrogen into said TaSi$_y$ film to form said TaSiN film by a method selected from the group consisting of:
   a) exposing said TaSi$_y$ film to a NH$_3$-containing plasma;
   b) exposing said TaSi$_y$ film to a N$_2$-containing plasma; and
   c) exposing said TaSi$_y$ film to a thermal NH$_3$-containing gas.

25. The method of claim 24, wherein heating said precursor includes heating to a temperature of about 85° C.

26. The method of claim 24, wherein said pressure to deliver said vapor is at least about 5 Torr.

27. The method of claim 24, wherein said TaSi$_y$ film is deposited onto a silicon-based substrate having at least one recessed surface feature.

28. The method of claim 24, further comprising depositing a copper metallization layer on the TaSiN film.

29. The method of claim 24, wherein said incorporating nitrogen comprises the method (a) of exposing said TaSi$_y$ film to a NH$_3$-containing plasma.

30. The method of claim 29, wherein said plasma is generated with a plasma power in the range of about 0.01–10 kW.

31. The method of claim 29, wherein said exposing of method (a) is for a time of about 2–600 seconds.

32. The method of claim 29, wherein said NH$_3$-containing plasma further includes N$_2$.

33. The method of claim 24, wherein said incorporating nitrogen comprises the method (b) of exposing said TaSi$_y$ film to a N$_2$-containing plasma.

34. The method of claim 33, wherein said plasma is generated with a plasma power in the range of about 0.01–10 kW.

35. The method of claim 33, wherein said exposing of method (b) is for a time of about 2–600 seconds.

36. The method of claim 24, wherein said incorporating nitrogen comprises the method (c) of exposing said TaSi$_y$ film to a thermal NH$_3$-containing gas.

37. The method of claim 36, wherein said exposing of method (c) is for a time of about 2–600 seconds.

38. The method of claim 24, wherein said depositing and nitrogen incorporating steps are repeated to form a TaSiN film of desired thickness.

39. The method of claim 24, wherein said depositing step is effected to deposit a TaSi$_y$ film up to about 100 Å, followed by said nitrogen incorporating step, and said depositing and nitrogen incorporating steps are repeated until said TaSiN film is formed to a desired thickness.

40. A method of depositing a nitrified tantalum silicide (TaSiN) barrier film on a semiconductor device substrate having a temperature in the range of about 250° C.–450° C., the method comprising:
   depositing a TaSi$_y$ film on said substrate by a thermal chemical vapor deposition (TCVD) process including delivering a tantalum pentachloride precursor to a reaction chamber containing said substrate without a carrier gas by heating said precursor to a temperature in the range of about 130° C.–150° C. sufficient to produce a vapor of said precursor to provide a pressure of at least about 3 Torr to deliver said vapor of said precursor and combining said vapor with a process gas comprising silane,
   then incorporating nitrogen into said TaSi$_y$ film to form said TaSiN film by a method selected from the group consisting of:
   a) exposing said TaSi$_y$ film to a NH$_3$-containing plasma;
   b) exposing said TaSi$_y$ film to a N$_2$-containing plasma; and
   c) exposing said TaSi$_y$ film to a thermal NH$_3$-containing gas.

41. The method of claim 40, wherein heating said precursor includes heating to a temperature of about 140° C.

42. The method of claim 40, wherein said pressure to deliver said vapor is at least about 5 Torr.

43. The method of claim 40, wherein said TaSi$_y$ film is deposited onto a silicon-based substrate having at least one recessed surface feature.

44. The method of claim 40, further comprising depositing a copper metallization layer on the TaSiN.

45. The method of claim 40, wherein said incorporating nitrogen comprises the method (a) of exposing said TaSi$_y$ film to a NH$_3$-containing plasma.

46. The method of claim 45, wherein said plasma is generated with a plasma power in the range of about 0.01–10 kW.

47. The method of claim 45, wherein said exposing of method (a) is for a time of about 2–600 seconds.

48. The method of claim 45, wherein said NH$_3$-containing plasma further includes N$_2$.

49. The method of claim 40, wherein said incorporating nitrogen comprises the method (b) of exposing said TaSi$_y$ film to a N$_2$-containing plasma.

50. The method of claim 49, wherein said plasma is generated with a plasma power in the range of about 0.01–10 kW.

51. The method of claim 49, wherein said exposing of method (b) is for a time of about 2–600 seconds.

52. The method of claim 40, wherein said incorporating nitrogen comprises the method (c) of exposing said TaSi$_y$ film to a thermal NH$_3$-containing gas.

53. The method of claim 52, wherein said exposing of method (c) is for a time of about 2–600 seconds.

54. The method of claim 40, wherein said depositing and nitrogen incorporating steps are repeated to form a TaSiN film of desired thickness.

55. The method of claim 40, wherein said depositing step is effected to deposit a TaSi$_y$ film up to about 100 Å, followed by said nitrogen incorporating step, and said depositing and nitrogen incorporating steps are repeated until said TaSiN film is formed to a desired thickness.

* * * * *

UNITED STATES PATENT AND TRADEMARK OFFICE
CERTIFICATE OF CORRECTION

PATENT NO. : 6,586,330 B1
DATED : July 1, 2003
INVENTOR(S) : Audunn Ludviksson and Joseph T. Hillman It is certified that error appears in the above-identified patent and that said Letters Patent is hereby corrected as shown below:

<u>Title page,</u>
Item [56], References Cited, OTHER PUBLICATIONS,
"Wieser et al." reference, reads "*Copper Metalization by Ion Implanation of*" and should read -- *Copper Metallization by Ion Implantation of* --.
"Fischer et al." reference, reads "*Metalization Scheme*" and should read -- *Metallization Scheme* --.
"Fischer et al." reference, reads "www.tu.dresden.de/ethihm/" and should read -- www.tu-dresden.de/ethihm/ --.
Wiser et al." reference, reads "www.tudresden.de/etinm/" and should read -- www.tu-dresden.de/ethihm/ --.

<u>Column 2,</u>
Line 31, reads "www.tu-dresden.de/etihm/" and should read -- www.tu-dresden.de/ethihm/ --.
Line 37, reads "www.tu-dresden.de/etihm/" and should read -- www.tu-dresden.de/ethihm/ --.

<u>Column 3,</u>
Lines 1 and 4, read "suicides" and should read -- silicides --.
Line 41, reads "CuITaSiN/SiO$_2$" and should read -- Cu/TaSiN/SiO$_2$ --.
Line 54, reads "DESCRIPION" and should read -- DESCRIPTION --.
Line 55, reads "TCVD-TaSi" and should read -- TCVD- TaSi$_y$ --.

<u>Column 4,</u>
Line 33, reads "system IS" and should read -- system 15 --.
Line 52, reads "hydrogen H$_2$) for" and should read -- hydrogen (H$_2$) for --.

<u>Column 9,</u>
Line 3, reads "100 521" and should read -- 100 Å --.
Line 54, reads "Cu/TaSi/SiO$_2$" and should read -- Cu/TaSi$_y$/SiO$_2$ -- .

<u>Column 10,</u>
Line 38, reads "NH$_4$ Cl formation" and should read -- NH$_4$Cl formation -- (There should not be a space between the "$_4$" and "C").

UNITED STATES PATENT AND TRADEMARK OFFICE
CERTIFICATE OF CORRECTION

PATENT NO.   : 6,586,330 B1
DATED        : July 1, 2003
INVENTOR(S)  : Audunn Ludviksson and Joseph T. Hillman It is certified that error appears in the above-identified patent and that said Letters Patent is hereby corrected as shown below:

<u>Column 13,</u>
Line 8, reads "about 100 Å min." and should read -- about 100 Å /min --.
Line 45, reads "suicide" and should read -- silicide --.

Signed and Sealed this

Eighteenth Day of January, 2005

JON W. DUDAS
*Director of the United States Patent and Trademark Office*